US008429615B2

(12) United States Patent
Kunie et al.

(10) Patent No.: US 8,429,615 B2
(45) Date of Patent: Apr. 23, 2013

(54) SEMICONDUCTOR INTEGRATED CIRCUIT

(75) Inventors: Shuichi Kunie, Kanagawa (JP); Hiroki Machimura, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 1259 days.

(21) Appl. No.: 12/232,073

(22) Filed: Sep. 10, 2008

(65) Prior Publication Data

US 2009/0083712 A1    Mar. 26, 2009

(30) Foreign Application Priority Data

Sep. 26, 2007 (JP) ................. 2007-249083

(51) Int. Cl.
*G06F 9/45*  (2006.01)
(52) U.S. Cl.
USPC ........................................ 717/124
(58) Field of Classification Search ............. 717/124
See application file for complete search history.

(56) References Cited

U.S. PATENT DOCUMENTS

| 6,463,562 | B1 | 10/2002 | Otsuka |
| 2009/0079468 | A1* | 3/2009 | Redgrave et al. ............... 326/38 |

FOREIGN PATENT DOCUMENTS

| CN | 1276533 A | 12/2000 |
| EP | 1 096 386 A3 | 7/2002 |
| JP | 1-93838 A | 4/1989 |
| JP | 3-288241 A | 12/1991 |
| JP | 11-65883 A | 3/1999 |
| JP | 2004-94451 A | 3/2004 |
| JP | 2004-252684 | 9/2004 |
| JP | 2004-272679 A | 9/2004 |
| JP | 2005-352591 | 12/2005 |

OTHER PUBLICATIONS

Notification of Reason(s) for Refusal dated Apr. 3, 2012, with English translation.
United Kingdom Office Action dated Jan. 16, 2009.
Chinese Office Action dated Sep. 21, 2011, with English translation.
Notification of Reason(s) for Refusal dated Aug. 16, 2011, with English translation.

\* cited by examiner

*Primary Examiner* — John Chavis
(74) *Attorney, Agent, or Firm* — McGinn IP Law Group, PLLC

(57) ABSTRACT

An object of the present invention is to solve a problem that, if the state of a macro that is a debug target changes by a factor other than a debugger while the debugger debugs the macro as a target, the debugger becomes unable to continue debugging and the debugging terminates abnormally. In order to solve the aforementioned problem, disclosed is a semiconductor integrated circuit including a first register that stores a value indicating that the macro is in a reset state in response to a reset signal received during debugging of the macro, and a second register that stores a value indicating whether or not the macro has been in the reset state in the past by receiving a reset signal.

12 Claims, 5 Drawing Sheets

SEMICONDUCTOR INTEGRATED CIRCUIT

BACKGROUND OF THE INVENTION

1. Field of the Invention

The present invention relates to a semiconductor integrated circuit. More particularly, the invention relates to a semiconductor integrated circuit including a macro that receives a control signal.

2. Description of the Related Art

Heretofore, a debugger used for debugging a program generally recognizes an execution state of the program by acquiring execution history information on the program in advance and then by referring to and analyzing the execution history information after an abnormal termination of the debugging. In this method, the user can easily acquire data indicating information acquired when the debugging terminates abnormally. However, as to information indicating how the debugging terminated abnormally, the user needs to review and then analyze the information. In this respect, Japanese Patent Application Publication No. 2004-252684 discloses a debugging method including: an information acquisition step having the steps of outputting execution history information at the time of execution of a program, acquiring debug information required for executing the program at a later time, and outputting information for associating the execution history information with the debug information; and a step of reproducing the state when any execution history information is outputted, by use of information acquired in the information acquisition step and then re-executing the program. With the method disclosed in Japanese Patent Application Publication No. 2004-252684, the cause of an abnormal termination of debugging is specified easily by use of the information acquired in the information acquisition step.

Furthermore, Japanese Patent Application Publication No. 2005-352591 discloses a multiprocessor system that attempts to improve a debugging efficiency by setting multiple breakpoints, without adding a specific hardware device dedicated to debugging. Regarding the setting of breakpoints, this multiprocessor system allows breakpoint occurrence conditions to be individually set in multiple CPUs by use of a breakpoint setting table. The multiprocessor system is configured to interrupt the execution of a debug target program and then to call a debugger program in a case where all of these conditions are satisfied and also information in the breakpoint setting table and information in a breakpoint history table match with each other.

In the aforementioned conventional techniques, however, there are the following problems. Suppose that the state of a certain macro that is a debug target changes by a factor other than the debugger while the certain macro is being debugged as the debug target by the debugger. Incidentally, the state of a macro refers to an internal signal or an output signal of the macro, for example. A possible scenario is that when a macro other than the macro being the debug target transmits a control signal such as a reset signal to the debug target macro, the state of the debug target macro receiving this control signal transitions, for example. In this case, the state of the debug target macro transitions despite that the macro is being debugged by the debugger. As a result, the debugger loses information indicating the position of the program to be executed during the execution of debugging and then terminates the debugging abnormally (hangs). Such an abnormal termination occurs since the debugger cannot recognize the external cause such as the control signal to be transmitted by a factor other than the debugger.

In an actual system including multiple masters, for example, a master/slave relationship exists even among multiple macros that are all masters. Accordingly, there is a case where a master among these multiple macros resets a slave among these multiple macros. In a case where a debugger debugs these macros, it is thus necessary to provide, in a program, a setting to prohibit a master that becomes active during the debugging from resetting a salve. Such a setting is, however, not within the original sequence of a software program.

SUMMARY

The semiconductor integrated circuit according to the present invention includes a macro that transitions to a certain state upon receipt of a control signal; a first register that stores a value indicating whether or not this macro is receiving the control signal; and a second register for storing a value indicating whether or not the macro has received the control signal in the past before the macro starts receiving the control signal. Suppose that the debugger becomes unable to continue debugging since the state of the macro transitions by a factor other than the debugger while the debugger is debugging this macro as the target. At this time, by referring to the first and second registers, the debugger can recognize a factor causing the debugger to become unable to continue debugging and then perform required processing corresponding to the factor. For example, by referring to the first and second registers, the debugger can recognize that the macro being the debug target has received a control signal in the past, and then, a transition of the state of the macro, which is not detected by the debugger, has occurred. In this case, the debugger can start debugging again by performing processing required for restarting the debugging, in view of the fact that the debug target macro has transitioned in the past. For example, the debugger performs processing for matching information on the debug target macro known to itself with information on the debug target macro after the state of the debug target macro has transitioned by a control signal transmitted from a different macro. After the completion of such processing, the debugger can restart the debugging of the debug target macro. In addition, the debugger can recognize that a control signal is being transmitted to the debug target macro from a different macro and that the state of the debug target macro is thus fixed to the state based on the control signal. In this case, the debugger waits for the different macro to stop the transmission of the control signal to the debug target macro, and the debugger can start the debugging again by performing the processing required for restarting the debugging after the different macro stops the transmission of the control signal to the debug target macro.

According to the present invention, even when a debugger becomes unable to continue debugging since the state of a macro being debugged by the debugger changes by a factor other than the debugger, the debugger can restart the debugging without causing an abnormal termination of the debugger.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE EMBODIMENT

Hereinafter, a specific embodiment to which the present invention is applied will be described in detail with reference to the drawings. It should be noted that the embodiment will be described by use of a specific example as appropriate in the following description, but such a specific example does not limit the scope of the claims of the present invention.

Figure 1:
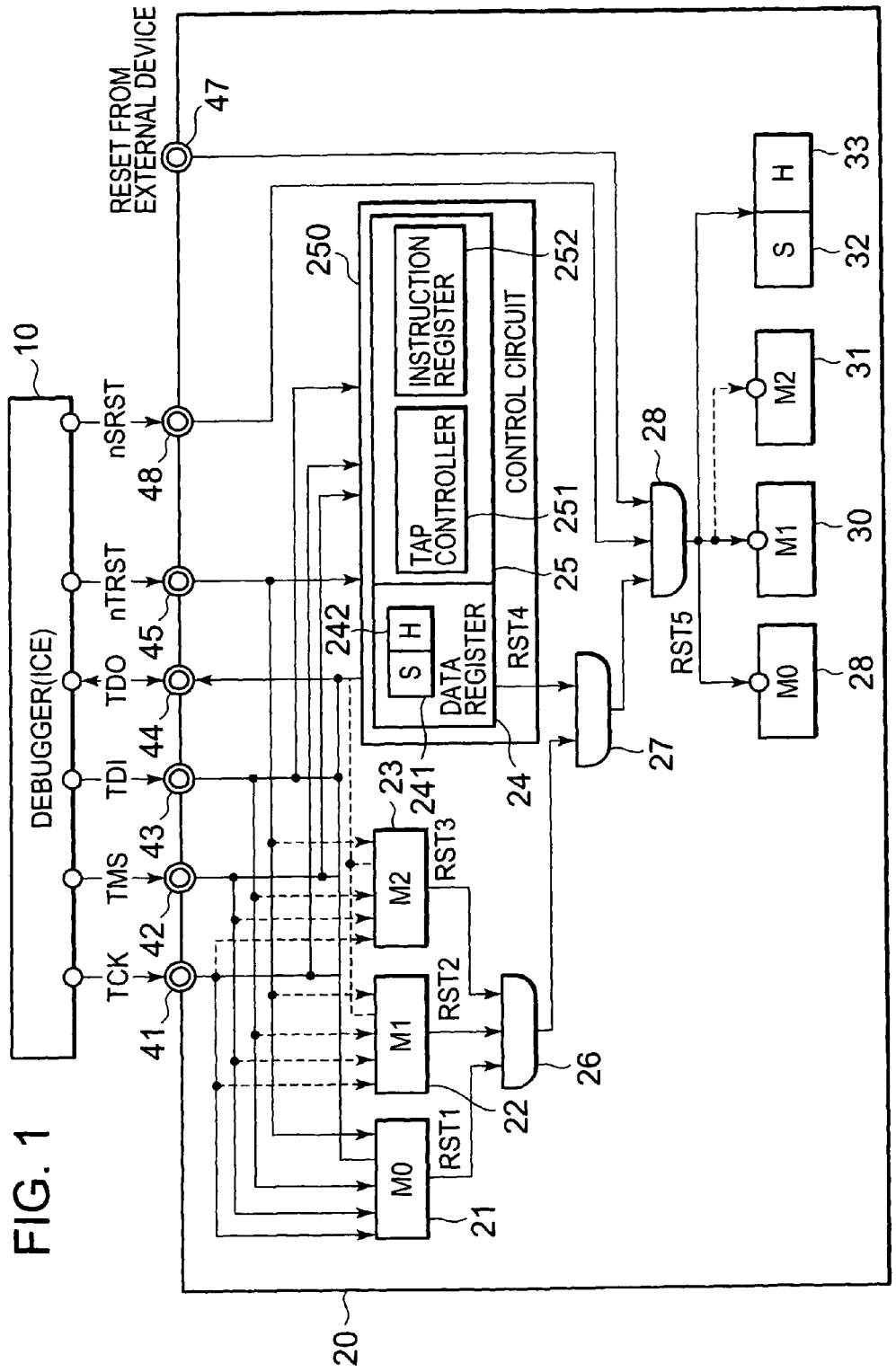
FIG. 1 is a diagram showing a semiconductor integrated circuit according to an embodiment of the present invention.

FIG. 1 is a diagram showing a semiconductor integrated circuit according to an embodiment of the present invention. A debugger 10 transmits JTAG signals and a reset signal nSRST to a semiconductor integrated circuit 20 as a control signal and debugs a macro. The JTAG signals are the signals defined by the JTAG standard (IEEE 1149.1) and refer to five signals including TCK, TMS, TDI, TDO and nTRST, herein. The nSRST signal is a reset signal for debugging a CPU. Various operations based on these signals will be described later. The semiconductor integrated circuit 20 is a system-on-chip (SOC) including multiple macros 21 to 23, a data register 24, a TAP 25, an AND gate 26, an AND gate 27 and an AND gate 28. The multiple macros 21 to 23 function as the masters and also output reset signals RST1 to RST3, respectively. The data register 24 receives JTAG signals via terminals 41 to 44 and also outputs a reset signal RST4. The TAP 25 receives JTAG signals likewise and controls the data register 24 or the like on the basis of the received JTAG signals. The AND gate 26 receives the RST1 to RST3. The AND gate 27 receives a signal outputted from the AND gate 26 and also receives the reset signal RST4 from the data register 25. The AND gate 28 receives a signal outputted from the AND gate signal 27 and also receives the nSRST signal outputted from the debugger 10. The AND gate 28 also receives a reset signal that is outputted from an outside of the semiconductor integrated circuit 20 and that is received by the semiconductor integrated circuit 20 via a terminal 47. The AND gate 28 outputs a reset signal RST5.

Here, macros 29 to 31 included in the semiconductor integrated circuit 20 shown in FIG. 1 are the same as macros 21 to 23, respectively. Although the macros 21 to 23 are the macros each functioning as a master, each of the macros 21 to 23 also becomes a macro that functions as a slave for any one of the macros 21 to 23. Moreover, there is a case where the macro 21, which is the master, transmits a control signal to the macro 22 or 23, which is also the master. The control signal to be transmitted in this case is a reset signal causing the macro 22 or 23 to be in a reset state, for example. FIG. 1 represents such a case in the following manner. The macro 21 first outputs a reset signal RST1 that is low-active, and then this reset signal RST1 is received by the macro 30 representing the same macro as the macro 22 or the macro 31 representing the same macro as the macros 23 via the AND gate circuits 26 to 28. This is because the macro 22 and 30 are the same, and the macro 23 and 31 are the same. Furthermore, there is a case where the macro 21 controls itself. In other words, the macro 21 causes its own state to be in the aforementioned reset state. FIG. 1 represents such a case in the following manner. The macro 21 first outputs an RST1 signal and then this RST1 signal is received by the macro 29 via the AND gate circuits 26 to 28. This is because the macros 21 and 29 represent the same macro. Here, the term, "reset state" indicates a certain specific state of the internal signal or the output signal of a macro (high level or low level). In a case where a macro receives a reset signal indicating an active signal value, the internal signal or the output signal of the macro keeps a state corresponding to the active reset signal.

The TAP 25 shown in FIG. 1 is a controller that performs an operation based on the JTAG standard (IEEE 1149.1) and includes a TAP controller 251 and an instruction register 252. The TAP controller 251 receives TCK, TMS and nTRST among the JTAG signals from a debugger. TCK is a clock signal, and the TAP controller 251 operates in synchronization with this TCK. TMS is a signal that controls a specific operation of the TAP controller 251. The TAP controller 251 acquires TMS outputted from the debugger on the rising edge of TCK. The instruction register 252 receives a TDI signal and a TDO signal among the JTAG signals. The TDI signal is a signal outputted from the debugger to the instruction register 252 and the data register 24 of the TAP 25. The TDI signal is a serial bit stream, for example. The debugger transmits an instruction code to the TAP controller 251 in order to cause the TAP controller 251 to execute a desired operation. The debugger 10 outputs this instruction code as a TDI signal. The TAP controller 251 stores such an instruction code in the register 252, then interprets an instruction corresponding to the stored instruction and then executes the instruction. The TDO signal is an output signal from the data register 24 and the instruction register 252. For example, the result of an arithmetic computation based on the instruction executed by the TAP controller 251 is outputted from the data register 24 to the debugger as a TDO signal.

The data register 24 is a register controlled by the TAP 25 on the basis of the JTAG signals. The data register 24 includes a status register 241 (hereinafter, referred to as an S register) and a history register 242 (hereinafter, referred to as an H register). In FIG. 1, an S register 32 and an H register 33 are described separately from an S register 241 and an H register 242 both included in the data register 24. The S registers 241 and 32 are the same registers. Moreover, the H registers 242 and 33 are the same registers. As described above, FIG. 1 shows that the macros 21 to 23 and the macros 29 to 31 are respectively the same. This is because the macros 21 to 23 respectively function as the masters, but each of the macros may function as a slave for any one of the macros. In accordance with such a notation, the S register 241 and the H register 242 both included in the data register 24 and the S register 32 and the H register 33 connected to the macros 29 to 31 are the same. In other words, the S register 32 and the H register 33 are a type of registers included in the data register 24.

The data register 24 includes a boundary-scan register, a bypass register and other data registers. The boundary-scan register is placed at the boundary between a core logic pin and an input/output pin. The bypass register forms a path that allows the TDI signal outputted from the debugger to bypass the boundary-scan register as the TDO signal. The data register 24 may further include a register for a different use as an option. For example, the data register 24 may include an IDcode register for identifying the device or the manufacturer, or the like. In this embodiment, the data register 24 includes the S register 32 and the H register 33 (these registers are the same as the S register 241 and the H register 242, respectively). The S register 32 and the H register 33 are both controlled by the TAP 25 on the basis of the JTAG signals. The functions of the S register 32 and the H register 33 will be described later.

Figure 2:
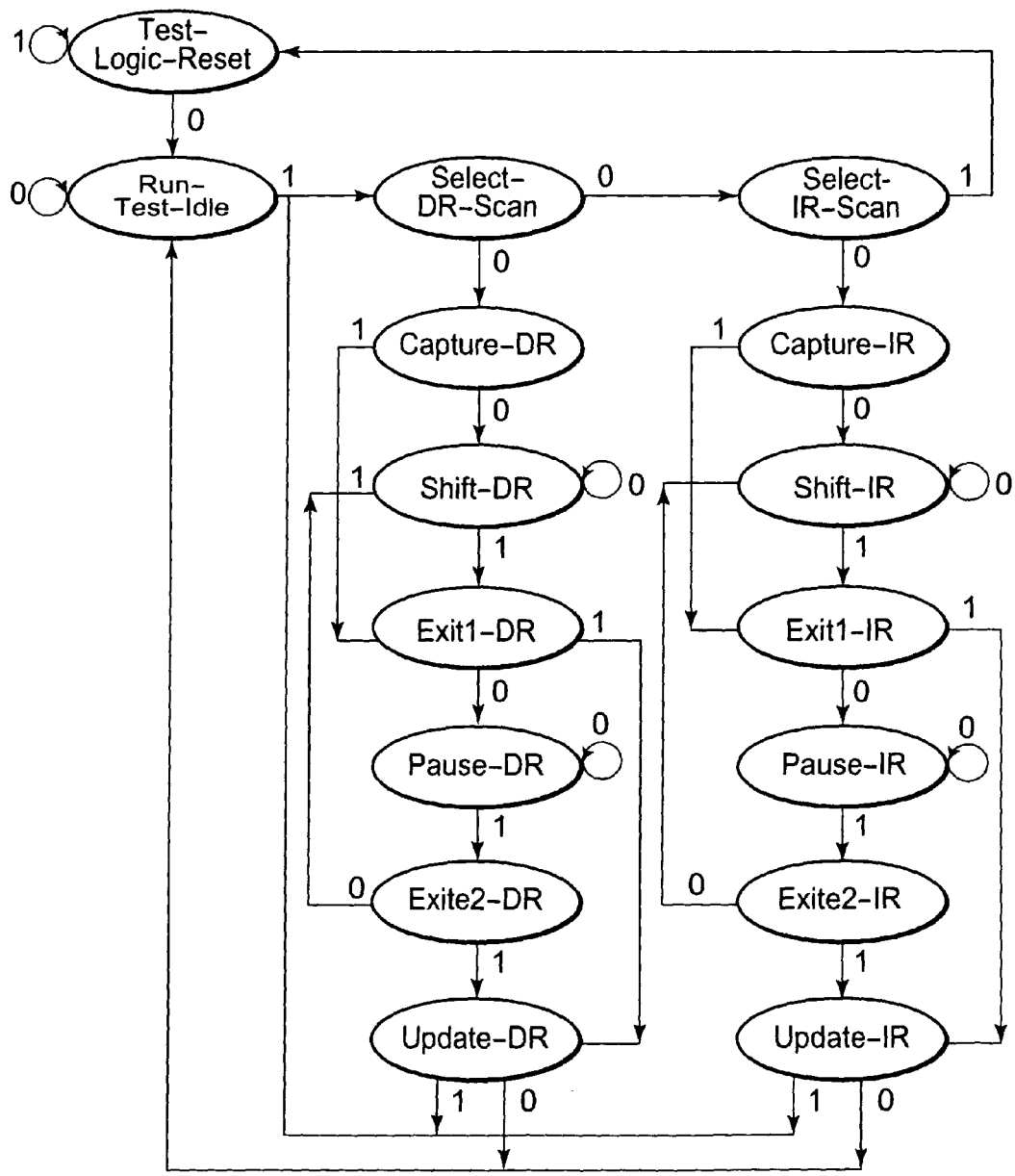
FIG. 2 is a diagram showing states of a TAP controller 251.

Here, FIG. 2 shows a relationship between an operation of the TAP controller 251 included in the TAP 25 and TMS. FIG. 2 illustrates a state machine showing the transition of an operation state of the TAP controller 251. The operation state of the TAP controller 251 transitions on the basis of the TMS signal acquired by the TAP controller 251 in response to the rising edge of TCK.

In Test-Logic-Reset, all test logic is disabled, and the normal operation of the integrated circuit (IC) is enabled. Regardless of the initial state, the operation state of the TAP controller 251 transitions to a Test-Logic-Reset state when receiving TMS of a high signal level five times corresponding to the rising edge of TCK. Furthermore, although nTRST is a reset signal for the TAP controller 251, nTRST is used optionally since the operation state of the TAP controller 251 transitions to the Test-Logic-Reset state in accordance with the aforementioned manner. In a case where the operation state of the TAP controller 251 is Run-Test-Idle, the TAP controller 251 causes the test logic within the IC to be active only when a specific instruction exists. Other than this case, the TAP controller 251 causes the test logic within the IC to be in an idol state.

The operation state of the TAP controller 251 proceeds to a Capture-DR state or a Select-IR-Scan state via a Select-DR-Scan state.

The operation state of the TAP controller 251 transitions to a Capture-IR state or the Test-Logic-Reset state from the Select-IR-Scan state.

In Capture-IR, a pattern of fixed values is read in parallel for the instruction register 252 on the rising edge of TCK.

In Shift-IR, the instruction register 252 responds to the rising edge of TCK and sequentially acquires serial bit streams, which are TDI signals. The debugger outputs an instruction code as a TDI signal. Then, the instruction register 252 acquires the instruction code outputted from the debugger.

In Exit1-IR, the TAP controller 251 transitions to any one of a Pause-IR state and an Update-IR state.

In Pause-IR, the TAP controller 251 is allowed to temporarily stop the shifting of the instruction register 252.

In Exit2-DR, the operation state of the TAP controller 251 transitions to any one of the Shift-IR state and the Update IR state.

In Update-IR, the TAP controller 251 executes an instruction corresponding to the instruction code stored in the instruction register 252 in the Shift-IR state.

In Capture-DR, on the rising edge of TCK, data are read in parallel into the data register selected by the current instruction.

Shift-DR, Exit1-DR, Pause-DR, Exit2-DR and Update-DR are the same as the Shift-IR, Exit1-IR, Pause-IR, Exit2-IR and Update-IR states of the instruction path.

As has been described above, the TAP controller 251 is a state machine including 16 types of states. The operation state of the TAP controller 251 transitions on the basis of the TMS signal and the TCK signal. Then, the TAP controller 251 controls the data register, the instruction register 252, a multiplexor and the like and thereby implements JTAG functions. A test reset (TRST) signal is a signal for initializing the TAP controller 251 and is optional. The TRST signal is inputted to the TAP controller 251 via the terminal 45. In a case where TMS is in an "H" state and also the rising edge of TCK is detected five times, the TAP controller 251 is also initialized.

The JTAG signals such as aforementioned TDI, TDO, TMS and TCK are inputted to the control circuit 250 and the macros 21 to 23 via the terminals 41 to 44. Moreover, the reset signal nSRST for debugging a CPU and a reset signal from an outside of the semiconductor integrated circuit 20 are inputted via the terminal 46 and the terminal 47, respectively.

Next, a description will be given of operations of the debugger 10 and the semiconductor integrated circuit 20 when the debugger 10 debugs a macro included in the semiconductor integrated circuit 20. The description will be given with an assumption that the debugger 10 debugs the macro (M0) 21 (that is, the macro 29). The arrows each indicated by a dotted line and heading towards the macros 22 and 23 and the macros 30 and 31 in FIG. 1 indicate that the macros 22 and 23, that is, the macros 30 and 31 are not debug targets. Here, suppose that while the debugger debugs the macro 21, a different macro transmits some kind of a control signal to the macro 21, so that the state of the macro 21 receiving the control signal changes. Specifically, the state of the internal signal or the output signal of the macro 21 changes. Hereinafter, this control signal is assumed to be a reset signal as a specific example. Specifically, suppose that while the debugger 10 debugs the macro 21, a reset signal RST2 is outputted from the macro 22, for example, and then, the reset signal RST2 is received by the macro 29. In this case, although the debugger 10 is debugging the macro 21, the state of the macro 21 becomes a reset state without any relation to the control performed by the debugger 10. The debugger 10 detects that the state of the macro 21 known to itself and the actual state of the macro 21 no longer match with each other. In this case, the debugger 10 needs to perform processing for matching the state of the macro 21 known to itself and the actual state of the macro 21 with each other. This is because unless the debugger performs such processing, the debugger 10 cannot restart the debugging of the macro 21, so that the debugging of the macro 21 being performed by the debugger 10 has to terminate abnormally. In this respect, the debugger 10 executes processing for referring to values stored in the S register 32 and the H register 33.

Here, a description will be conceptually given of basic functions and operations of the S register 32 and the H register 33. It should be noted that specific operations related to the JTAG signals or the TAP controller 251 will be described later. The S register 32 stores information on whether or not the macro 21, which is a debug target, is receiving a reset signal. Specifically, the S register stores information on whether or not the RST5 to be outputted from the AND gate 28 is received and whether or not the macros 21 to 23, the data register 24, the debugger 10 and an element outside the semiconductor integrated circuit 20 have outputted the RST1 to RST4, the nSRST and a reset signal, respectively, to the macro 29 (that is, the macro 21). For example, suppose that each reset signal becomes active when the signal value is "0." In this case, if any one of the RST1 to RST4, the nSRST and the reset signal outputted from the outside becomes "0," the signal value becomes the reset signal RST5 via the AND gates 26, 27 and 28 and is thus received by the macro 29. The S register 32 receives the reset signal RST5 whose signal value has become "0" and stores the reset signal RST5 therein. Thereafter, in a case where all of the RST1 to RST4, the nSRST and the reset signal outputted from the outside are cancelled, that is, in a case where these signal values become "1," the RST5 becomes "1." The S register 32 newly stores, therein, the value of the RST5, which has become "1" in place of the value "0" stored previously. As described, the S register 32 is a register that stores the value indicating whether or not the macro 21 is currently in a reset state.

On the other hand, the H register 33 stores information on whether or not the macro 21, which is a debug target, has received any of the RST1 to the RST4, the nSRST and a reset signal outputted from an outside of the semiconductor integrated circuit 20 before receiving the reset signal of the macro 21 to be stored in the S register 32. In other words, the H register 33 is a register that stores a history indicating whether or not the operation state of the macro 21 has become a reset state in the past. For example, suppose that each reset signal becomes active when the signal value is "0." In this case, if any one of the RST1 to the RST4, the nSRST and a reset signal outputted from the outside has become "0" prior to the start of receiving the reset signal of the macro 21 to be stored in the S register, that is, in a case where any one of the signals has become "0" in the past, the signal value has become the reset signal RST5 via the AND gates 26, 27 and 28 and thus has been received by the macro 29. This case indicates that the macro 21 has responded to the aforementioned signals, and the state of the macro 21 has become a reset state in the past. The H register 33 receives the reset signal RST5 whose signal value has become "0" and stores the value therein. Even when all of the RST1 to the RST4, the nSRST and the reset signal outputted from the outside are cancelled thereafter, that is, when the signal values of these signals become "1," the H register 33 does not replace the signal value "0" of the RST5 previously stored therein with "1." The H register 33 retains the signal value "0."

The operation of the debugger 10 when the debugger 10 debugs the macro 21 will be described again. As described above, the debugger 10 refers to the S register 32 and the H register 33. The debugger 10 outputs a TDI signal among the JTAG signals to the instruction register 252 included in the TAP 25. The TDI signal in this case is an instruction code. The instruction code indicates the operation for outputting the stored values of the S register 32 and the H register 33 included in the data register 24 to the debugger 10. When the operation state of the TAP controller 251 included in the TAP 25 becomes Shift-IR, the instruction register 252 acquires the instruction code outputted from the debugger 10 on the rising edge of TCK to be received. Thereafter, when the operation state of the TAP controller 251 transitions to Update-IR, the TAP 25 executes an instruction corresponding to the instruction code stored in the instruction register 252. Specifically, the TAP 25 outputs each of the signal values stored in the S register 32 and the H register 33 included in the data register 24 to the debugger 10. In this case, each of the signal values outputted from the S register 32 and the H register 33 is a TDO signal. The debugger 10 receives, as TDO signals, the values respectively stored in the S register 32 and the H register 33.

The debugger 10 receives the values stored in the S register 32 and the H register 33. Through this operation, the debugger can recognize that whether or not the macro 21, which is a debug target, has been in a reset state in the past and that whether or not the macro 21 is currently in a reset state. The debugger 10 performs the following processing in accordance with the acquired values of the S register 32 and the H register 33. First, consider a case where the value of the S register 32 acquired by the debugger 10 is "1," and the value of the H register 33 acquired by the debugger 10 is "0." In this case, the debugger 10 recognizes that the macro 21 is not receiving an active reset signal at this time and that the macro 21 has been in a reset state in the past although the macro 21 is not currently in a reset state. The debugger 10 immediately performs a process of restarting the debugging of the macro 21. It should be noted that the process of restarting the debugging varies depending on the specification of the debugger to be used. Specifically, the processes are different from one another depending on the manufacturers of debuggers. As a process of restarting the debugging, for example, one may be a process of attempting to match information on the macro 21 included in the debugger itself with information on the macro 21, which has changed by the reset signal received by the macro 21. After the completion of the required process of restarting the debugging, the debugger 10 starts the debugging of the macro 21 again.

On the other hand, consider a case where the value of the S register 32 acquired by the debugger 10 is "0," and the value of the H register 33 acquired by the debugger 10 is "1" or "0." In this case, the debugger 10 recognizes that the macro 21, which is a debug target, is receiving an active reset signal at this time and that the macro 21 is currently in a reset state. Accordingly, the debugger 10 first waits until the macro 21 no longer receives the reset signal. In order to perform this operation, the debugger 10 needs to continue to acquire the value of the S register 32. For this reason, the debugger 10 performs the following operation, for example. The debugger 10 transmits a TDI signal to the instruction register 252 again. The TDI signal in this case is also an instruction code. The instruction register 252 acquires an instruction code in accordance with the TCK likewise. The TAP 25 thereafter executes an instruction corresponding to the instruction code newly acquired by the instruction register 252. In this case, the TAP 25 continues to output the value of the S register 32 to the debugger 10 until the value stored in the S register 32 changes from "0" to "1." The value of the S register 32 to be received by the debugger 10 is outputted to the debugger 10 as a TDO signal in this case as well. The debugger 10 continues to refer to the value of the S register 32 and waits until the value of the S register 32 changes from "0" to "1." Then, suppose that the value of the S register 32 to be received by the debugger 10 changes from "0" to "1" at a certain point. The debugger 10 performs the process of restarting the debugging of the macro 21 thereafter. After the completion of the process, the debugger 10 restarts the debugging of the macro 21.

The debugger 10 performs the aforementioned processing in a case where the debugger 10 becomes unable to continue the debugging of the macro 21 since the state of the macro 21 has become in a reset state without any relation to the control performed by the debugger 10. The debugger 10 can start the debugging of the macro 21 again by performing the aforementioned processing. In other words, even if the state of the macro 21 becomes a reset state without any relation to the control performed by the debugger 10, the debugging does not terminates abnormally.

Figure 3:
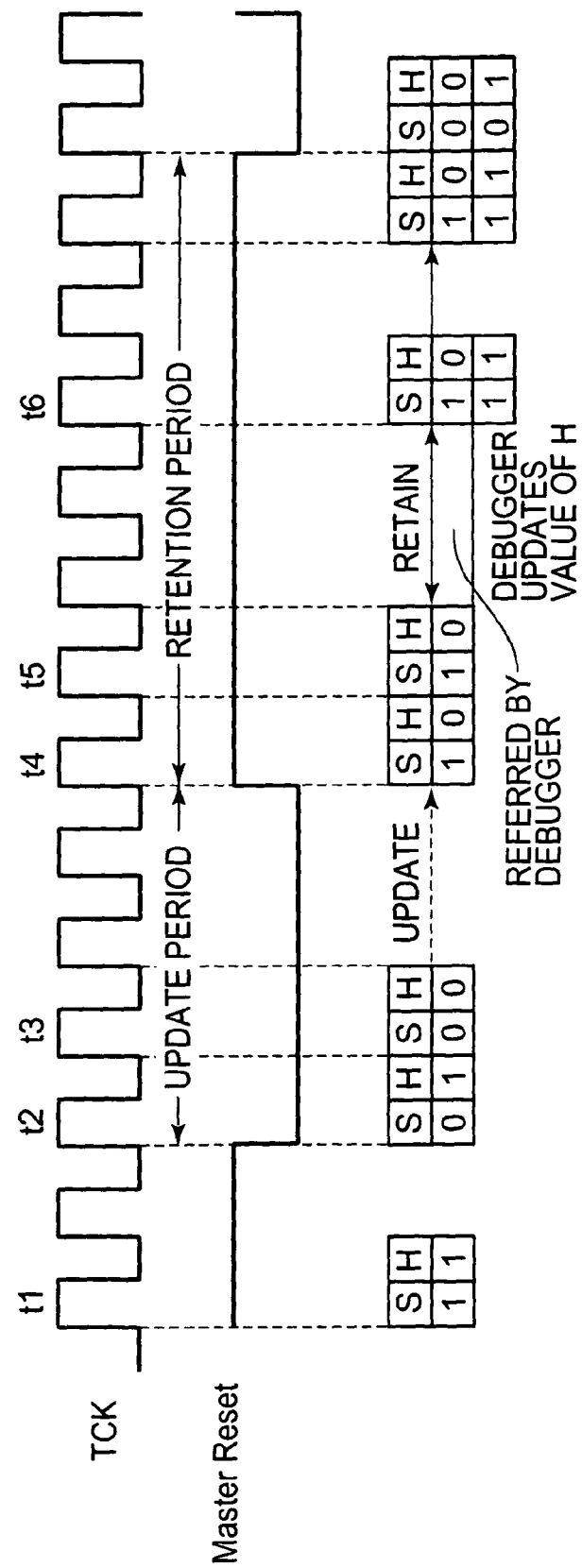
FIG. 3 is a diagram provided for describing a reset monitoring method according to the embodiment of the present invention.

FIG. 3 shows the operations of the S register 32 and the H register 33, on a conceptual basis, without considering the operation of the TAP 25 in accordance with the JTAG signals. In FIG. 3, "S" denotes the value stored in the S register 32, and "H" denotes the value stored in the H register 33. TCK is a clock signal. Master Reset is a reset signal to be received by a macro being debugged by the debugger 10. This reset signal becomes active when the signal is at a low level. As shown with time point t1, the S register 32 and the H register 33 stores values, "1," respectively, as the initial values. At time point t2, the Master Reset signal becomes a low level, and the debug target macro, transitions to a reset state. At this point of time, the value stored in the S register 32 changes to "0." The value stored in the H register 33 does not change at time point t2. At time point t3, the Master Reset signal is at a low level, and the debug target macro is in a reset state. In this case, the S register 32 continues to store "0" therein.

On the other hand, the H register 33 responds to the event that the Master Reset signal changes from a high level to a low level at time point t2, and updates the value stored therein from "1" to "0." The operations of the S register 32 and the H register 33 between time point t3 and time point t4 are as follows. The S register 32 stores the value of the Master Reset signal therein on each rising edge of the clock. The S register 32 continues to store the value "0" therein between time point t3 and time point t4 since the Master Reset signal stays at a low level during this period. On the other hand, the H register 33 retains the value "0" stored therein at time point t3 in response to the event that the Master Reset signal changes to a low level at time point t2, so that the debug target macro becomes in a reset state.

The Master Reset signal changes from a low level to a high level at time point t4. Specifically, the debug target macro is no longer in the reset state. In this case, the S register 32 updates the value to be stored therein from "0" to "1" since the S register 32 stores the value of the Master Reset signal on each rising edge of the clock. On the other hand, the H register 33 retains the value "0" stored therein at time point t3 in response to the event that the Master Reset signal changes to the low level, so that the debug target macro becomes in a reset state at time point t2.

The Master Reset signal is at a high level and constant between time point t5 and time point t6. Accordingly, the values stored in the S register 32 and the H register 33, respectively, do not change.

Suppose that the macro that debugs the debug target macro refers to the values stored in the S register 32 and the H register 33 at time point t6. Such a "referring operation" is performed following the aforementioned flow. In this case, during any time period after time point t6, the values to be stored in the S register 32 and the H register 33 do not change until the Master Reset signal changes to a low level again. The operation during a period of time after the Master Reset signal changes to a low level again is the same as the operation that has been described so far.

On the other hand, there is a case where the debugger performs an operation for initializing the value of the H register 33 at time point t6. The H register 33 includes a function to initialize, at any timing, the value to be stored therein. Specifically, this initialization operation is performed in the following case, for example. Suppose that the debugger refers to the values stored in the S register 32 and the H register 33 and thereafter performs a process required for restarting the debugging. Suppose that the debugger then restarts the debugging of the macro. In this case, the history information stored in the H register 33 is no longer necessary. Accordingly, the debugger initializes the value stored in the H register 33. Considering a case with FIG. 1, the debugger 10 may transmit an instruction code to the TAP 25, and then the TAP 25 may initialize the value of the H register 33.

The description has been given so far of the debugging of the macro 21 performed by the debugger 10 in cooperation with the TAP 25, the S register 32 and the H register 33. Hereinafter, a description will be given of operations of the S register 32 and the H register 33 while considering in further detail a viewpoint in which the TAP 25 performs operations based on the JTAG standard. The TAP 25 performs various controls in accordance with the transitions of the operation state of the TAP controller 251 shown in FIG. 2. In this embodiment, when the TAP 25 receives, from the debugger 10, an instruction to output the values stored in the S register 32 and the H register 33, the values of the S register 32 and the H register 33 when the TAP controller 251 is in a Capture-DR state are outputted to the debugger. On the other hand, the TAP 25 writes the value of the RST5 when the operation state of the TAP controller 251 is in an Update-DR state into the H register 33.

Although the TAP 25 performs the operation for the S register 32 and the H register 33 to store the values when the TAP controller 251 is in a certain operation state, the following problem occurs as to the updating of the value to be stored in the H register 33. Consider a case where the operation state of the TAP controller 251 transitions in the order of Capture-DR, Shift-DR, Exit1-DR, Pause-DR, Exit2-DR to Update-DR and then the operation state returns to Capture-DR again after the completion of the operation state of Update-DR and then transitions in the same order. Then, suppose that the value of the reset signal RST5 changes from "1" to "0" in the Capture-DR state, for example, and then changes from "0" to "1" in an operation state after the Capture-DR state but before the Update-DR state. The TAP 25 writes the value of the RST5 when the operation state of the TAP controller 251 is in the Update-DR state into the H register 33. In this case, the H register 33 stores the signal value "1" therein without storing the history indicating that the value of the RST5 has become "0" once in the past. In a case where the H register 33 cannot store the correct receiving history of the reset signal of the debug target macro, the debugger becomes unable to continue the debugging of the macro, so that the debugging terminates abnormally.

Figure 5:
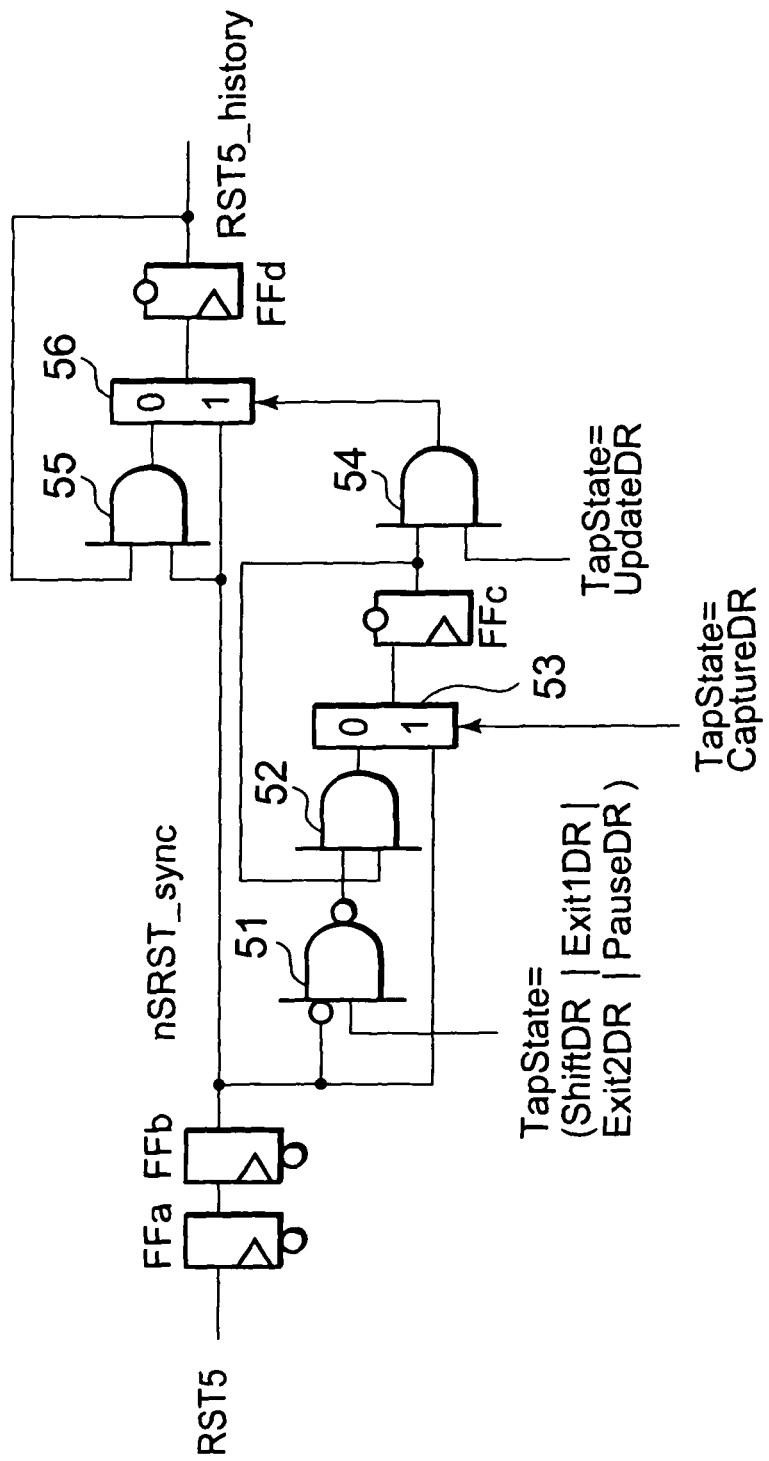
FIG. 5 is a diagram showing a configuration of an H register.

FIG. 5 shows a configuration of the H register 33 that can solve this problem. The element that actually stores the history indicating whether or not the debug target macro has become in a reset state is a flip-flop FFd. Flip-flops FFa and FFb are registers for causing the RST5 signal in FIG. 1 to be in synchronization with TCK. The H register 33 shown in FIG. 5 also includes AND circuits 51, 52, 54 and 55, and selectors 53 and 56. An FFc retains the output signal of the FFb acquired when the operation state of the TAP controller 251 is Capture-DR. This value of the output signal of the FFb is the value of the RST5. It should be noted that the S register 32 is placed in front of the FFa and stores a change in the RST5. Since the FFa and the FFb are placed between the S register 32 and the H register 33, the H register 33 updates the stored value two clock cycles after the S register 32 updates the stored value.

At this time, the FFc stores the value "0" if the signal value of the RST5, which is the output signal of the FFb, changes from "1" to "0" during a period in which the operation state of the TAP controller 251 is Shift-DR, Exit1-DR, Exit2-DR and Pause-DR. In a case where the FFc stores the value "0" once, the FFc retains "0" even if the value of the output signal of the FFb changes from "0" to "1," thereafter. On the other hand, the AND gate 54 outputs the value "1" in a case where the output of the FFc is "1," and also the operation state of the TAP controller 251 is Update-DR. The AND gate 54 outputs the value "0" in the other cases. On the other hand, the FFd stores the value "0" in response to the event that the signal value of the RST5, which is the output signal of the FFb, changes from "1" to "0" during the period in which the operation state of the TAP controller 251 is Shift-DR, Exit1-DR, Exit2-DR and Pause-DR. Then, the FFc outputs the value, "0," to the AND gate 54.

Figure 4:
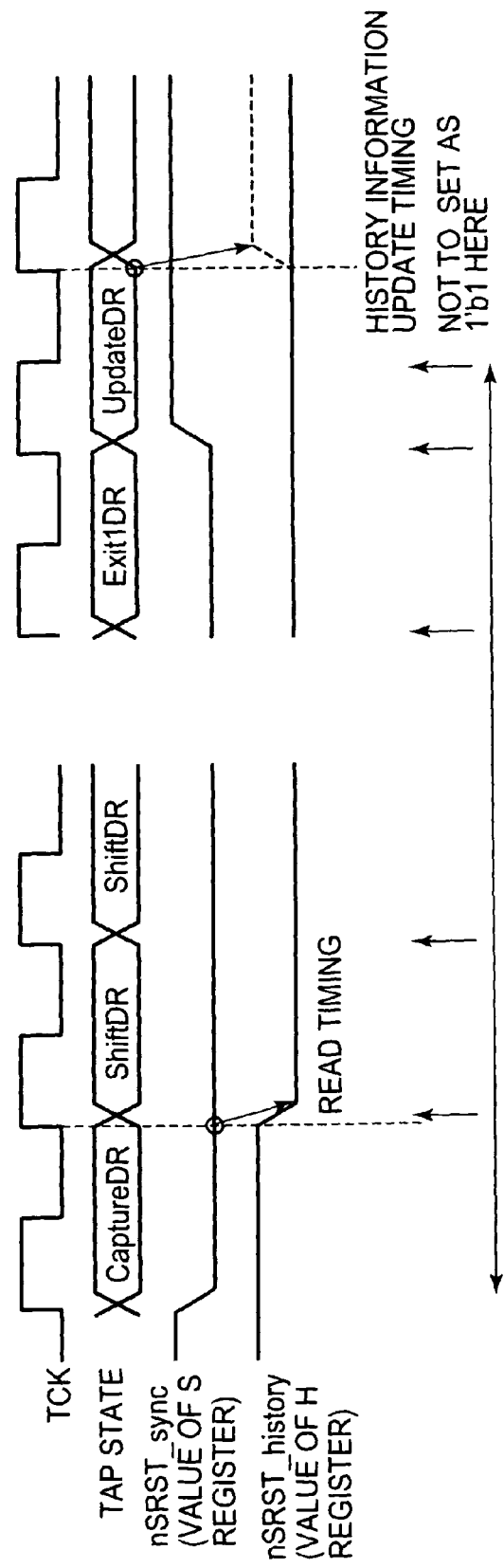
FIG. 4 is a diagram provided for describing a TAP state.

Accordingly, even if the output signal of the FFb changes from "0" to "1" while the operation state of the TAP controller 251 is Shift-DR, Exit1-DR, Exit2-DR and Pause-DR, and then, the operation state of the TAP controller 251 becomes Update-DR, thereafter, the output value of the AND gate 54 is "0." Accordingly, the selector 56 transmits the output signal of the AND gate 55, which is the value previously stored in the FFd, to the FFd, rather than transmitting the output signal of the FFb to the FFd. The FFd can thus retain the stored value "0." Specifically, as shown by a solid line in FIG. 4, the value stored in the H register 32 is not updated (the reset history information is not cleared) at the timing of clearing the information. Thereby, it is possible to leave, as a history, information on the reset signal that has become non active during the period after Capture-DR before Update-DR.

In this embodiment, in a system and an SOC each including multiple masters, by use of the S register 32 and the H register 33, the debugger 10 can monitor the current reset state and also a reset state in the past even when the macro 21 is reset in the following manners: The macro 21, which is the debug target macro (target), is reset by a factor outside the control performed by the debugger 10 for the macro 21; the debug target macro 21 resets itself; the debug target macro 21 is reset by a button switch or the like outside the system or the SOC; or another master resets the debug target macro 21 or the like. Here, the reset target resource by the reset is a resource existing within or outside the master and being used by the debugger 10 such as a breakpoint, a watchpoint, a status control register, a system that changes a JTAG chain length or the like.

Accordingly, the debugger 10 can determine the next action even if the debugger 10 no longer knows the state of the debug target macro. The debugger 10 thus can perform the resetting of the debug target and then continue debugging the debug target without causing itself to hang (abnormally terminate).

In addition, since a read and write operation for the state of reset monitoring can be performed by use of the JTAG chain, even if the debug target macro resets itself, the debugger can recognize the reset state. Accordingly, the usability of the debugger is improved.

It should be noted that the present invention is not limited to the foregoing embodiment, and as a matter of course, various modifications within a range not departing from the spirit and scope of the invention are possible.

It is apparent that the present invention is not limited to the above embodiments, but may be modified and changed without departing from the scope and spirit of the invention.

What is claimed is:

1. A semiconductor integrated circuit comprising:
   a macro capable of transitioning to a predetermined state;
   a first register coupled to said macro to receive a predetermined signal to store a first value indicating whether or not said macro is in said predetermined state at a specific time point, and to store a second value indicating whether or not the macro is in the predetermined state at another specific time point which is after said specific time point; and
   a second register configured to store said first value based on the predetermined signal of said specific time point as a value indicating whether or not said macro has been in said predetermined state before said specific time point whereas the second register retains said stored first value and does not update said first value to said second value based on the predetermined signal of said another specific time point.

2. The semiconductor integrated circuit according to claim 1, wherein said predetermined state comprises a reset state, and said macro transitions to said reset state in response to receiving a reset signal.

3. The semiconductor integrated circuit according to claim 1, wherein said first register stores said first and second values, respectively, when said macro is debugged.

4. The semiconductor integrated circuit according to claim 1, further comprising a control circuit that outputs said first value from said first and second registers to an external device and outputs said second value from said first register.

5. The semiconductor integrated circuit according to claim 4, wherein said control circuit outputs said first and second values to said external device in response to an instruction from said external device.

6. The semiconductor integrated circuit according to claim 4, wherein said external device comprises a debugger performing a debug of said macro.

7. The semiconductor integrated circuit according to claim 4, wherein said control circuit comprises a TAP controller capable of transitioning to a plurality of states including:
   a capture DR state in which said control circuit outputs said first and second values to said external device; and
   an update DR state in which said control circuit stores said second value in said second register, said control circuit transitioning to said update DR state after being in said capture DR state, and
   wherein said control circuit stores in said second register said second value indicating that said macro has been in said predetermined state, in response to transitioning to said update DR state, in case that said predetermined state of said macro is changed to another state between said capture DR state and said update DR state.

8. The semiconductor integrated circuit according to claim 1, wherein said predetermined signal comprises a reset signal.

9. The semiconductor integrated circuit according to claim 1, wherein the first and second registers are not configured as a shift register.

10. An integrated circuit comprising:
    a first register configured to receive a signal that causes the first register to store:
       a first value indicating whether a macro is in a first state at a first time; and
       a second value indicating whether the macro is in first state at a second time that is after the first time; and
    a second register configured to store a historical value indicating whether the macro was previously in the first state before the first time,
    wherein if the macro was previously in the first state, then the second register retains the historical value as the first value, otherwise the second register stores the historical value as a second value until the signal causes the first register to store the first value and then the second register retains the historical value as the first value.

11. The integrated circuit according to claim 10, wherein the signal is transmitted by a second macro.

12. The integrated circuit according to claim 11, wherein the signal comprises a reset signal for causing a state of the macro to transition.

* * * * *